(12) United States Patent
Thallner

(10) Patent No.: US 7,246,445 B2
(45) Date of Patent: Jul. 24, 2007

(54) ALIGNMENT DEVICE

(76) Inventor: Erich Thallner, Bubing 71, AT-4782, St. Florian (AT)

( * ) Notice: Subject to any disclaimer, the term of this patent is extended or adjusted under 35 U.S.C. 154(b) by 417 days.

(21) Appl. No.: 11/013,734

(22) Filed: Dec. 16, 2004

(65) Prior Publication Data

US 2005/0146169 A1   Jul. 7, 2005

(30) Foreign Application Priority Data

Dec. 17, 2003 (DE) ................................ 103 59 273

(51) Int. Cl.
B23Q 1/44 (2006.01)
(52) U.S. Cl. ........................................ 33/1 M; 33/533
(58) Field of Classification Search ................ 33/1 M, 33/533, 568, 573, 613, 645
See application file for complete search history.

(56) References Cited

U.S. PATENT DOCUMENTS

| 3,155,383 | A |   | 11/1964 | Whitmore |         |
|-----------|---|---|---------|----------|---------|
| 3,744,902 | A |   | 7/1973  | Henker   | 355/53  |
| 4,346,867 | A | * | 8/1982  | Dick et al. | 248/424 |
| 4,524,520 | A | * | 6/1985  | Levy     | 33/1 M  |
| 4,575,942 | A |   | 3/1986  | Moriyama | 31/1 M  |
| 4,600,083 | A | * | 7/1986  | Parent et al. | 33/1 M |
| 5,040,431 | A |   | 8/1991  | Sakino et al. | 74/479 |
| 5,063,676 | A | * | 11/1991 | Gerber   | 33/1 M  |
| 5,701,677 | A | * | 12/1997 | Yamaguchi et al. | 33/1 M |
| 5,881,466 | A | * | 3/1999  | Yamaguchi et al. | 33/1 M |
| 6,817,104 | B2| * | 11/2004 | Kaneko et al. | 33/568 |
| 2004/0177520 | A1 | * | 9/2004 | Nakamura et al. | 33/1 M |

FOREIGN PATENT DOCUMENTS

| DE | 37 40 561 A1 | 7/1988 |
| DE | 4345090      | 7/1995 |
| DE | 4436320      | 1/1996 |
| DE | 100 11 512 A1 | 9/2001 |
| DE | 10128713     | 1/2003 |
| EP | 0 437 741 A2 | 7/1991 |
| EP | 0 469 956 A1 | 2/1992 |
| EP | 1048924 A2   | 11/2000 |
| JP | 61-270044    | 11/1986 |
| WO | WO 91/17564  | 11/1991 |
| WO | WO 95/23053  | 8/1995 |

OTHER PUBLICATIONS

European Search Report for European Patent Application No. 04 02 8528.0, Oct. 11, 2005.

* cited by examiner

Primary Examiner—G. Bradley Bennett
(74) Attorney, Agent, or Firm—Kunsner & Jaffe

(57) ABSTRACT

The present invention relates to an alignment device for aligning an object in a plane.

18 Claims, 2 Drawing Sheets

ALIGNMENT DEVICE

Figure 1:
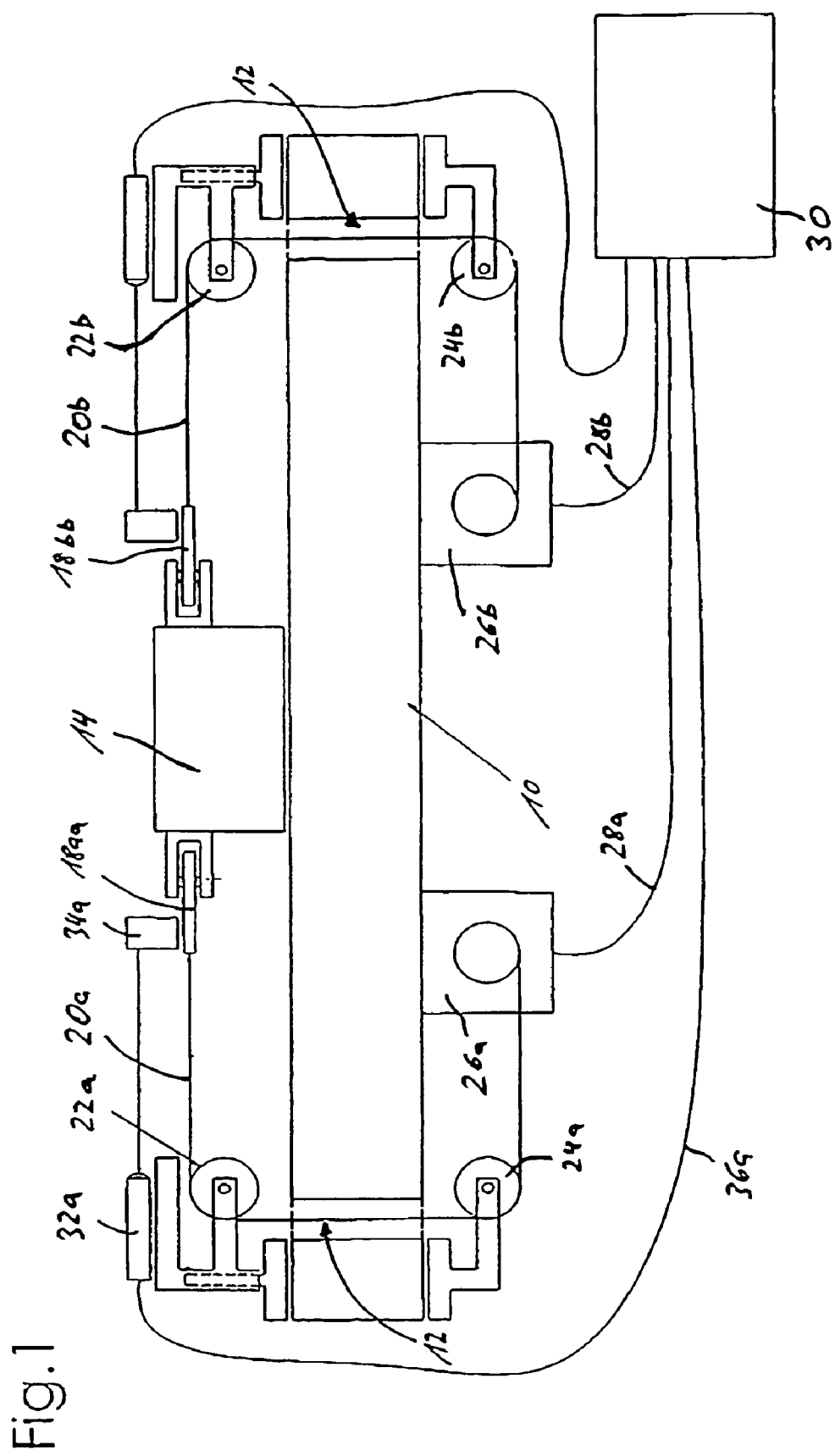

The present invention relates to an alignment device for aligning an object in a plane.

In the production of electrical structures (circuits) on semiconductor disks (wafers) using lithographic methods, for example, it is necessary to position the wafer precisely in relation to a mask in a horizontal plane. A corresponding set of problems also results in the field of further industrial process steps during the manufacturing, machining, or processing of wafers.

The related art and the present invention will be described in greater detail in the following on the basis of the alignment of a wafer on/in a seat. The present invention is, however, not restricted to this field of application in this regard, but rather is used for aligning any arbitrary objects.

While the alignment of the wafer in the x and y directions within a plane may be monitored using a microscope, for example, it causes significant constructive problems to cut the wafer to size on a corresponding seat part which ensures the desired mobility in the x and y directions as well as secure fixing of the particular final position.

DE 101 28 713 A1 describes an alignment table of the above-mentioned type having an external frame, an intermediate frame, which is movable in a first direction in relation to the external frame, and a receiving part for the object to be aligned, this receiving part being situated so it in turn is displaceable in a further direction within the intermediate frame. Mechanical adjustment devices allow the displaceability of the parts cited to one another and their subsequent fixing in a desired position. The adjustment paths are greatly limited.

This alignment table has proven itself in principle. The present invention is to provide an alternative constructive design. A secondary aspect is to ensure exact alignability even if pressure is exerted on the object to be aligned during further method steps, for example. This is the case, for example, if the object (such as a wafer, thermally deformable plastic, or a film) is embossed.

The present invention is based on the knowledge that it is not absolutely necessary, even for exact and extremely precise alignment (with tolerances in the μm range and below), to provide a more or less "rigid" alignment system. The desired object may also be achieved with a kind of "floating" alignment, if the following requirements are fulfilled in particular:

Very small displacement paths in the x and y directions, for example, and corresponding angular displacements must be able to be implemented.

The alignment unit must be exactly definable after reaching the desired alignment position.

The basic idea of the present invention is to removably fix the object to be aligned in or on a seat, this seat able to be brought into the desired position along an associated table using tension elements. Independently of the size and shape of the seat, at least three tension elements are necessary in this case in order to be able to implement the desired x, y, and angular displacements.

If the three tension elements are positioned at the corners of an imaginary triangle, such as an equiangular triangle, for example, or, with four tension elements, in the region of the corners of a rectangle (particularly a square) or a trapezoid, the particular object may be aligned exactly in relation to all degrees of freedom cited.

Accordingly, in its most general embodiment, the present invention relates to an alignment device for aligning an object in a plane having the following features:

a table
a seat positionable on the table,
the seat being implemented for removable fixing of the object to be positioned,
at least 3 tension elements, each of which are linked at a first end to the seat and at a second end to the table,
the tension elements acting in at least two different directions.

The statement that the seat is to be positionable on the table means that the seat is displaceable in any arbitrary direction essentially parallel to the table surface. In this case, the table may be aligned horizontally. However, the table may also run diagonally to the horizontal, up to a vertical position.

The final position of the seat, in relation to the table, is set via the tension elements cited and may then be additionally fixed, as will be explained below.

The object to be aligned is removably fixed in the seat. This may be performed mechanically through clamping, catches, or the like, for example. Another possibility is to suction the object in place on or in the seat through (partial) vacuum. If the tension elements are linked to the seat, this means that when tension of a tension element is relieved, a tensile force, and thus a directional displacement, occurs on the seat. Other tension elements are accordingly moved along or tracked simultaneously in order to allow the desired displacement of the seat (and the object parallel thereto).

If one assumes that the seat is displaceably positioned on a horizontal table, and if one only observes one displacement direction (such as the x direction), it already results that the tension elements must act in opposing directions in order to be able to displace the seat to the right or left, for example. The feature, according to which the tension elements are to act in at least two different directions, does not necessarily mean opposing directions in this case. Rather, the basic orientation of the tension elements results therefrom. In this case, even two tension elements which engage at different sections of the seat and are angularly offset to one another, for example, not only cause a displacement right or left (or: up and down), but rather also simultaneously lead to angular displacement of the seat in relation to the table. This will also be explained in greater detail in the following.

To allow the desired angular displacement in particular, one embodiment of the present invention provides that the tension elements are positioned on the seat in an articulated way but fixed in place. The linkage point is fixed in this case. The orientation of the tension element in relation to the seat (for example, the angle between tension element and corresponding edge of the seat) may change, however. A device for winding and unwinding the tension element is positioned at a distance to the linkage point.

The tension elements may be guided between their ends over deflection rolls. They may also be guided through the table or below the table in this case, where motors are positioned, via which the tension elements may be activated, for example.

As already noted, the first ends of the tension elements are linked, for example, to diametrically opposing sections of the seat. For a seat which is square in horizontal projection, for example, two tension elements may be positioned along one side edge, one at each end, for example, and a third tension element may be positioned in the middle of the diametrically opposing edge.

The linkage regions of the tension elements are, for example, in the circumference of the seat.

The larger the distance of the linkage point of the tension elements to one another, the larger the adjustment possibilities for positioning the seat (of the object) are. According to one embodiment, the first ends of the tension elements accordingly have a maximum distance from one another.

With three tension elements, the linkage points may form the corners of an imaginary triangle. With four tension elements, the imaginary connection lines between the linkage regions (the first ends) may describe a rectangle, such as a square, or even a trapezoid.

With four tension elements, two tension elements may be positioned mirror symmetrically to two further tension elements. This embodiment will be explained in greater detail in the following description of the figures. In this way, outstanding adjustment possibilities are achieved with extremely short adjustment paths.

The tension elements may be cables, this term including wires, bands, and strings.

If the table has a calibration device, such as a raster, the position of the seat may be determined directly.

An independent measurement device may also be provided, which is used to determine the position of the seat on the table directly. This is an optical measuring unit, for example, such as a camera, a microscope, or the like.

According to a further embodiment, a measurement device is provided for determining the position or length of each first end of the tension elements.

Simultaneously, the position of the seat on the table is calculated via an analysis unit (a computer) from the corresponding coordinates. Such measurement devices may comprise transmitter/receivers, a transmitter/receiver unit able to be assigned to each tension element.

It was noted at the beginning that depending on the alignment of the seat on the table, the seat is preferably fixed (positioned) in place. This is important, for example, if the object to be aligned is subsequently pressure loaded, through embossing, for example. It is then ensured that even during the embossing procedure the position of the seat and therefore of the object is not changed.

The device may, for example, be a device for suctioning the seat in place on the table.

A corresponding suction unit may also be used for (temporary) fixing of the object on or in the seat. To replace the object, the vacuum is simply interrupted.

In order to allow mobility of the seat on the table which is as free of friction and therefore interference as possible, lubricants may be provided between seat and table. These may be liquid or viscous lubricants. However, mechanical lubricants, such as ball casters, etc. or the implementation of an air bearing are also possible. The term "air bearing" comprises embodiments which make use of the "Bernoulli effect", for example, in which an air film/cushion is provided between table and seat.

Although motion of the seat "on the table" is discussed above, this does not necessarily mean that the seat lies directly on the surface of the table; the seat is, however, displaced parallel to the table surface.

The air cushion (air bearing) mentioned may be interrupted and the seat may be suctioned in place on the table when the final alignment position is reached.

Further features of the present invention result from the features of the subclaims and the other application documents.

Figure 2:
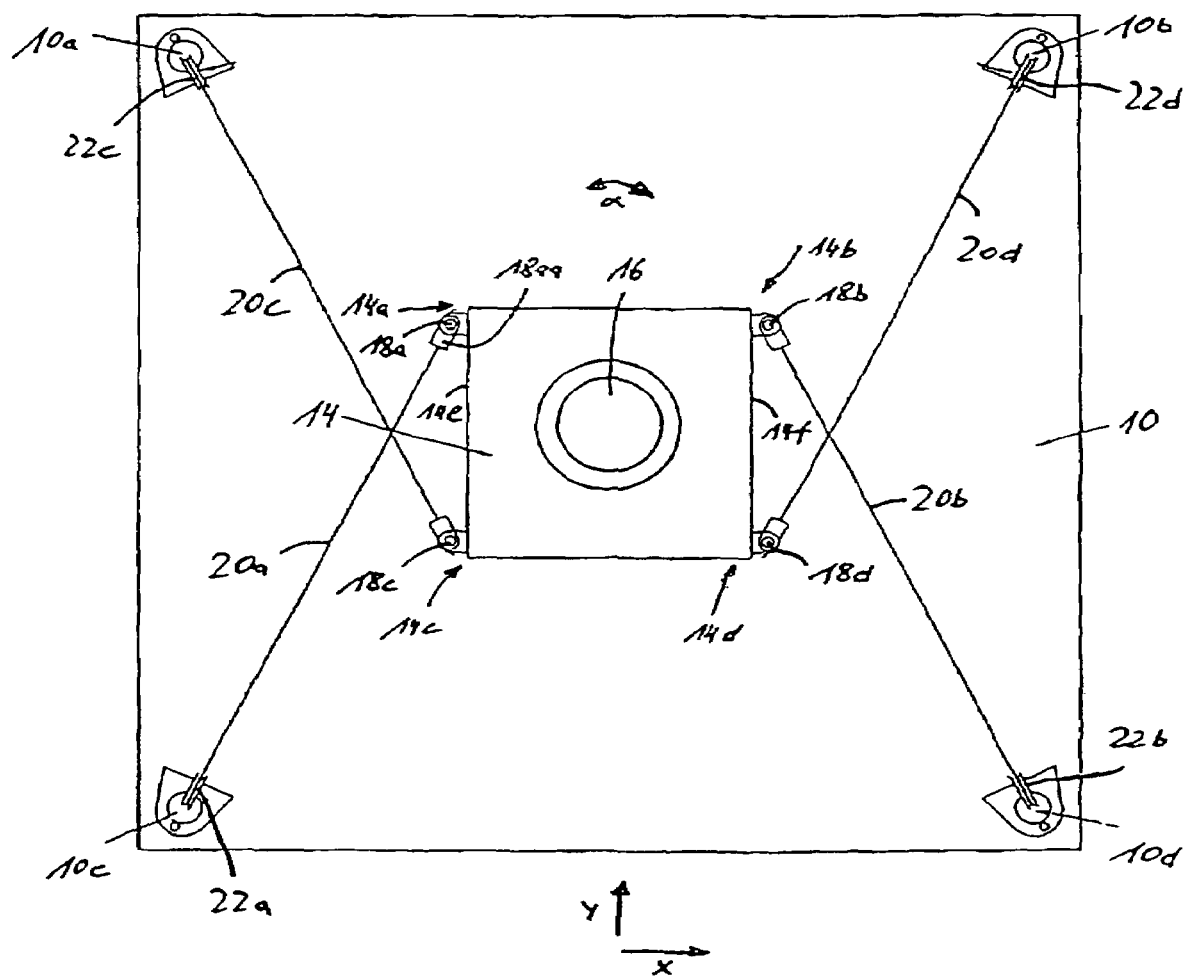

The present invention will be described in greater detail in the following on the basis of an exemplary embodiment. In this case:

FIG. 1 shows a schematic illustration of a partially cutaway side view of an alignment device according to the present invention, FIG. 2 shows a schematic illustration of a horizontal projection of the alignment device shown in FIG. 1.

The device comprises a table 10, which has a square area correspondingly having four corner regions 10a-d in this case. A hole 12 runs through the table in each of the corner regions 10a-d. A seat 14 lies approximately centrally on the table, which has a cuboid shape having a square outline and whose four corners are identified with 14a-d.

A wafer 16 to be positioned lies in a depression of the seat 14.

Joints 18a-d, which may be pivoted along a plane parallel to the table 10, are positioned in the corners 14a-d at diametrically opposing edges 14e, f of the seat 14.

A joint arm 18a extends from the joint 18a, from which a cable 20a runs in the direction toward the corner 10c of the table 10, where the cable 20a is guided around a deflection roll 22a through the associated opening 12 under the table 10, where it is guided around a further deflection roll 24a to a drive unit 26a, in which the cable 22a may be wound and unwound using a motor. A line 28a runs from the drive unit 26a to a computer 30.

Correspondingly, a cable 20b extends from a joint arm 18bb in the direction toward the corner 10d and runs over deflection rolls 22b, 24b to a drive unit 26b, from which a line 28b runs in turn to the computer 30.

In the same way, cables 20c, 20d extend from the linkage points 18c, 18d in the direction toward the diametrically opposing corners 10a, 10b of the table 10 and from there in turn over deflection rolls 22c, 22d through the openings 12 below the table to corresponding drive units (not shown), from which connection lines (also not shown) run in turn to the computer 30.

In the starting position shown, the cables 20a-d are tensioned. As may be seen, the cables 20a, 20b run in different directions (essentially opposite) to the cables 20c, 20d. In other words: the course of the cables 20a, 20b is essentially mirror symmetric to the course of the cables 20c, 20d.

The system is stable per se. The position of the seat 14 in relation to table 10 may be adjusted, however, and therefore the wafer 16 may be positioned in the desired way if the drive units (such as 26a, 26b) are now activated and at the same time the corresponding cables 20a-20d are shortened and/or lengthened (tracked). For example, through tension on the cables 20c, 20b, the seat 14 may be displaced both in the x direction and in the y direction. An angular displacement occurs simultaneously, which is shown by the arrow a. The cables 20a, 20d are tracked via the computer 30 and the associated drive units.

To determine the particular exact position of the seat 14, a distance measurement system is provided which operates based on lasers. In this case, such a measurement system is assigned to each cable 20a-d and is explained in the following for the cable 20a for exemplary purposes.

A transmitter 32a, which transmits a laser beam to a receiver 34a, which is positioned above the joint arm 18aa, is positioned in the corner region 10c above the deflection roll 22a With the aid of this measurement device, the length of the cable 20a between transmitter 32a and receiver 34a may be determined exactly. The transmitter 32a is positioned so it is fixed in place, but is pivotable (rotatable). The receiver 34a changes its position in accordance with the adjustment of the seat 14. The measurement device is also connected to the computer 30 via a line 36a.

In this way, the exact alignment of the seat 14 and therefore the wafer 16 may be calculated from the measurement data which all four measurement devices (for each cable 20*a-d*) provide, and this may be done continuously, during the adjustment (alignment) and in the final position.

Alternatively, an optical measurement device may be positioned above the seat 14, which indicates the exact position of the seat 14 on the table 10.

The table 10 may be provided with multiple capillary holes below the seat 14 which are connectable to a partial vacuum source, in order to be able to suction the seat 14 in place against the table after reaching the desired final position.

During the positioning of the seat 14, an air cushion may be implemented between the seat 14 and the table 10, for example, using the "Bernoulli effect", the same capillaries being able to be used.

The invention claimed is:

1. An alignment device for aligning an object (16) in a plane, having the following features:
    1.1 a table (10),
    1.2 a seat (14) positionable on the table (10),
    1.3 the seat (14) being provided for removable fixing of the object (16) to be positioned,
    1.4 at least three tension elements (20*a-d*), each of which is linked at a first end to the seat (14) and at a second end to the table (10),
    1.5 the tension elements (20*a-d*) acting in at least two different directions (x, y, α).

2. The alignment device according to claim 1,
    wherein the tension elements (20*a-d*) are positioned on the seat (14) in an articulated way (18*a-d*), but fixed in place.

3. The alignment device according to claim 1,
    wherein the tension elements (20*a-d*) are guided between their ends over deflection rolls (22*a-d*).

4. The alignment device according to claim 1,
    wherein the first ends of the tension elements (20*a-d*) are linked at diametrically opposing sections (14*e, f*) of the seat (14).

5. The alignment device according to claim 1,
    wherein the first ends of the tension elements (20*a-d*) are positioned in the circumference of the seat (14).

6. The alignment device according to claim 1,
    wherein the first ends of the tension elements (20*a-d*) have a maximum distance to one another.

7. The alignment device according to claim 1 having three tension elements,
    wherein imaginary connection lines between their first ends describe a triangle.

8. The alignment device according to claim 1 having four tension elements (20*a-d*),
    wherein imaginary connection lines between their first ends describe a rectangle.

9. The alignment device according to claim 8,
    wherein two tension elements (20*a, b*) are positioned mirror symmetrically to two further tension elements (20*c, d*).

10. The alignment device according to claim 8,
    wherein the imaginary connection lines describe a square.

11. The alignment device according to claim 1,
    wherein the tension elements (20*a-d*) are cables.

12. The alignment device according to claim 1 having a measurement device (32*a*, 34*a*) for determining the position of each first end of the tension elements (20*a-d*) and an analysis unit (30) for determining the position of the seat (14) on the table (10).

13. The alignment device according to claim 1 having a measurement device for direct determination of the position of the seat (14) on the table (10).

14. The alignment device according to claim 1 having a device for fixing the position of the seat (14) on the table (10) in place.

15. The alignment device according to claim 14,
    wherein the device is a device for suctioning the seat (14) in place on the table (10).

16. The alignment device according to claim 1 having means for removable fixing of the object (16) to be positioned on or in the seat (14).

17. The alignment device according to claim 16,
    wherein the means comprise a suction unit for fixing the object (16) on or in the seat (14) using partial vacuum.

18. The alignment device according to claim 1,
    wherein lubricants are positioned between table (10) and seat (14).

* * * * *